United States Patent
Policicchio

(10) Patent No.: US 10,159,355 B2
(45) Date of Patent: Dec. 25, 2018

(54) RECONFIGURABLE SOFA

(71) Applicant: Max Home, LLC, Fulton, MS (US)

(72) Inventor: Bruno Policicchio, Tupelo, MS (US)

(73) Assignee: Max Home, LLC, Fulton, MI (US)

( * ) Notice: Subject to any disclaimer, the term of this patent is extended or adjusted under 35 U.S.C. 154(b) by 0 days.

(21) Appl. No.: 15/957,678

(22) Filed: Apr. 19, 2018

(65) Prior Publication Data

US 2018/0303243 A1 Oct. 25, 2018

Related U.S. Application Data

(60) Provisional application No. 62/487,551, filed on Apr. 20, 2017.

(51) Int. Cl.
| | | |
|---|---|---|
| *A47C 20/02* | (2006.01) |
| *A47C 17/02* | (2006.01) |
| *A47C 13/00* | (2006.01) |
| *A47C 20/00* | (2006.01) |

(52) U.S. Cl.
CPC .......... *A47C 20/021* (2013.01); *A47C 13/005* (2013.01); *A47C 17/02* (2013.01)

(58) Field of Classification Search
CPC ....... A47C 20/021; A47C 17/00; A47C 17/14; A47C 17/34; A47C 17/37; A47C 13/005
See application file for complete search history.

(56) References Cited

U.S. PATENT DOCUMENTS

| | | | | |
|---|---|---|---|---|
| 6,826,789 B1* | 12/2004 | Choi | ............... | A47C 15/002 |
| | | | | 5/12.1 |
| 2008/0012416 A1* | 1/2008 | Richey | ............... | A47C 7/42 |
| | | | | 297/440.16 |
| 2011/0101747 A1* | 5/2011 | Chen | ............... | A47C 13/005 |
| | | | | 297/233 |
| 2012/0256464 A1* | 10/2012 | Chang | ............... | A47C 13/005 |
| | | | | 297/440.16 |
| 2015/0061344 A1* | 3/2015 | Yeh | ............... | A47C 17/02 |
| | | | | 297/440.1 |

FOREIGN PATENT DOCUMENTS

| | | | | | |
|---|---|---|---|---|---|
| CA | 2502090 A1 | * | 9/2005 | ......... | A47C 13/005 |
| DE | 29620078 U1 | * | 2/1997 | ......... | A47C 13/005 |
| DE | 10143627 A1 | * | 4/2003 | ............ | A47C 17/16 |
| EP | 2090192 A1 | * | 8/2009 | ............... | A47C 3/16 |

* cited by examiner

*Primary Examiner* — Timothy J Brindley
(74) *Attorney, Agent, or Firm* — Baker Donelson; Carl Davis

(57) ABSTRACT

A sofa (10) includes a sofa base (13) and an addition (14) coupled to the sofa base. The sofa base has a seating area (18) between two end armrests (19) which includes spacing for back cushions (20), seat cushions (21), and an empty seating space (22). The addition has an L-shaped addition base (24) and a U-shaped addition cushion (25). The addition base has an inside corner (28) configured to nest the front corner of the sofa base. The U-shaped addition cushion is positioned upon the L-shaped addition base and a portion of the base seating area which could be occupied by a seat seating space. Thus, the addition cushion completely covers the addition base and the empty seating space or portion of the seating area directly adjacent the armrest which is surrounded by the addition cushion on three sides.

15 Claims, 3 Drawing Sheets

RECONFIGURABLE SOFA

TECHNICAL FIELD

The present invention relates to the furniture. More particularly, the present invention relates to seating furniture, such as a sofa, which is adapted to be reconfigured to include additional areas of seating or a different arrangement of the seating area.

BACKGROUND OF INVENTION

The furniture industry includes a limited number of conventional furniture pieces for the home. Typically, these furniture pieces include sofas, chairs, ottomans, tables and the like. While these pieces upon initial selection may provide the desired seating arrangement, over time, the seating configuration may change due to personal taste, a move to a different location, or a reconfiguring of the furniture within the room.

Also, while the initial configuration of furniture, such as a sofa, provides a select seating arrangement, due to a change in the number of people requiring seating, the number of desired seats to accommodate everyone may change. This ability to change the seating configuration or the seating arrangement has not existed with previously known furniture.

Conventional furniture, while successful in providing an initial seating arrangement, nevertheless does not provide for the flexibility in changing the arrangement to different configurations. It is to such that the present invention is directed.

SUMMARY OF THE INVENTION

A sofa comprises a sofa base having two oppositely disposed armrests and a seating area including an empty seating space, and an addition removably coupled to the sofa base. The addition has a L-shaped addition base and a U-shaped cushion configured to wrap about three sides of the armrest and be positioned upon the L-shaped base and upon the sofa base seating space. In another aspect, the present invention provides a sofa comprising a sofa base and an addition. The sofa base has a first overall length and a first sub-length extending from one end of the sofa base, and the sofa base also has an overall depth along said one end of said sofa base extending from a front of the sofa base to a back of the sofa base. The addition has an addition base having (a) a front side and a back side with a first leg extending between the front side and the back side and a first interior depth generally equal to the overall depth of the one end of said sofa base and (b) a second leg extending along the front side with a second interior depth generally equal to the first sub-length of the sofa base. The addition also has an addition cushion having a first portion overlaying the addition base first leg and the addition base second leg and a second portion overlaying at least a portion of the sofa base.

In another aspect, the present invention provides a sofa comprising a sofa base and an addition. The sofa base has two oppositely disposed armrests and a seating area including at least one seat cushion and a seating space void of a sofa base seat cushion. The addition removably coupled to the sofa base has a L-shaped addition base and an addition cushion configured to occupy the sofa base seating space and overlay the L-shaped addition base.

DETAILED DESCRIPTION

Figure 1:
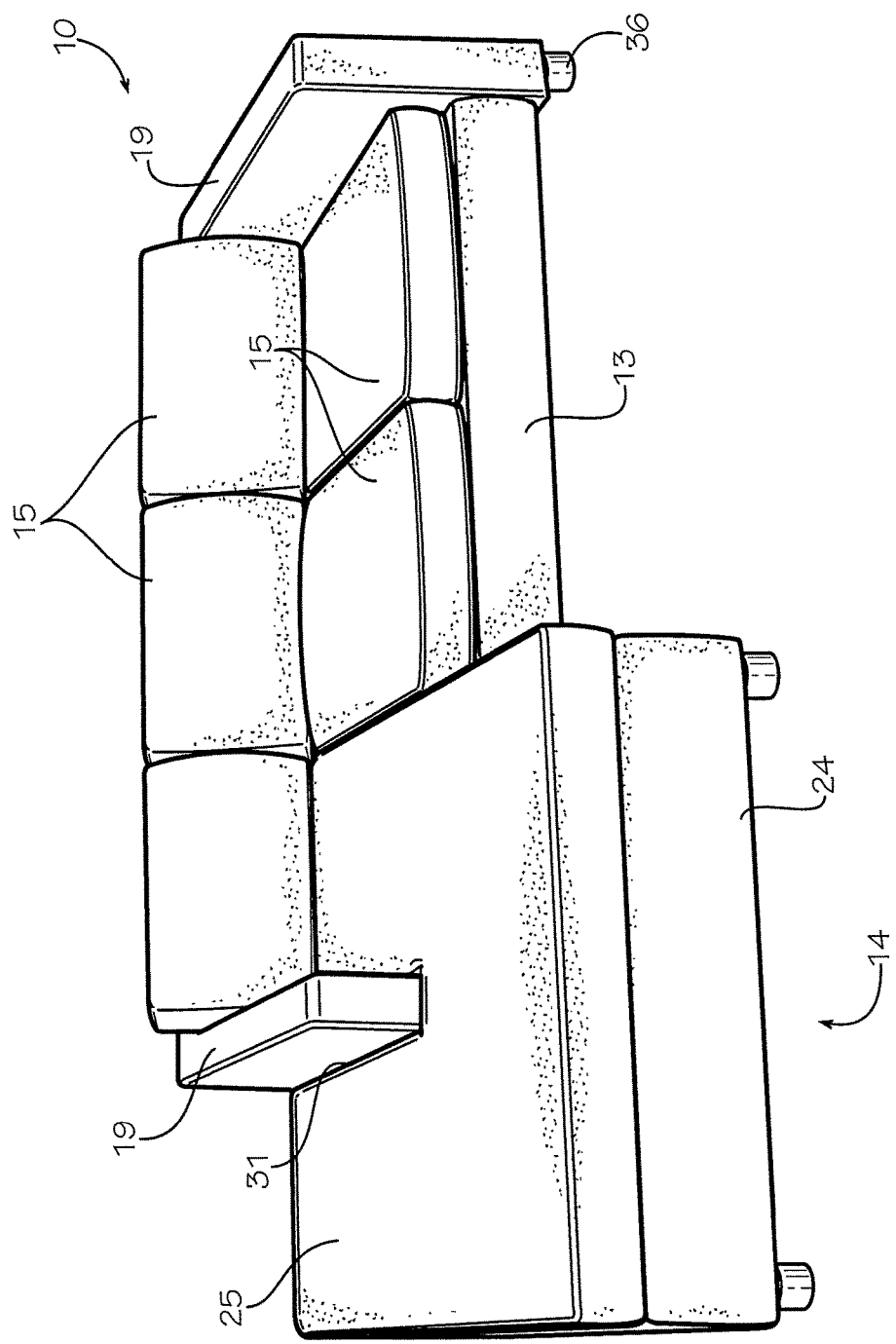
FIG. 1 illustrates a reconfigurable sofa in accordance with the present invention.

With reference to the drawings in which like parts have like reference numerals, the drawings illustrate a piece of furniture in the form of a reconfigurable sofa or couch 10 in accordance with the present invention. The sofa 10 includes a sofa base 13 of generally conventional construction, a supplemental piece or addition 14 removably mounted to the sofa base 13, and a series of cushions 15 adapted to fit upon the base 13 and addition 14.

Figure 2:
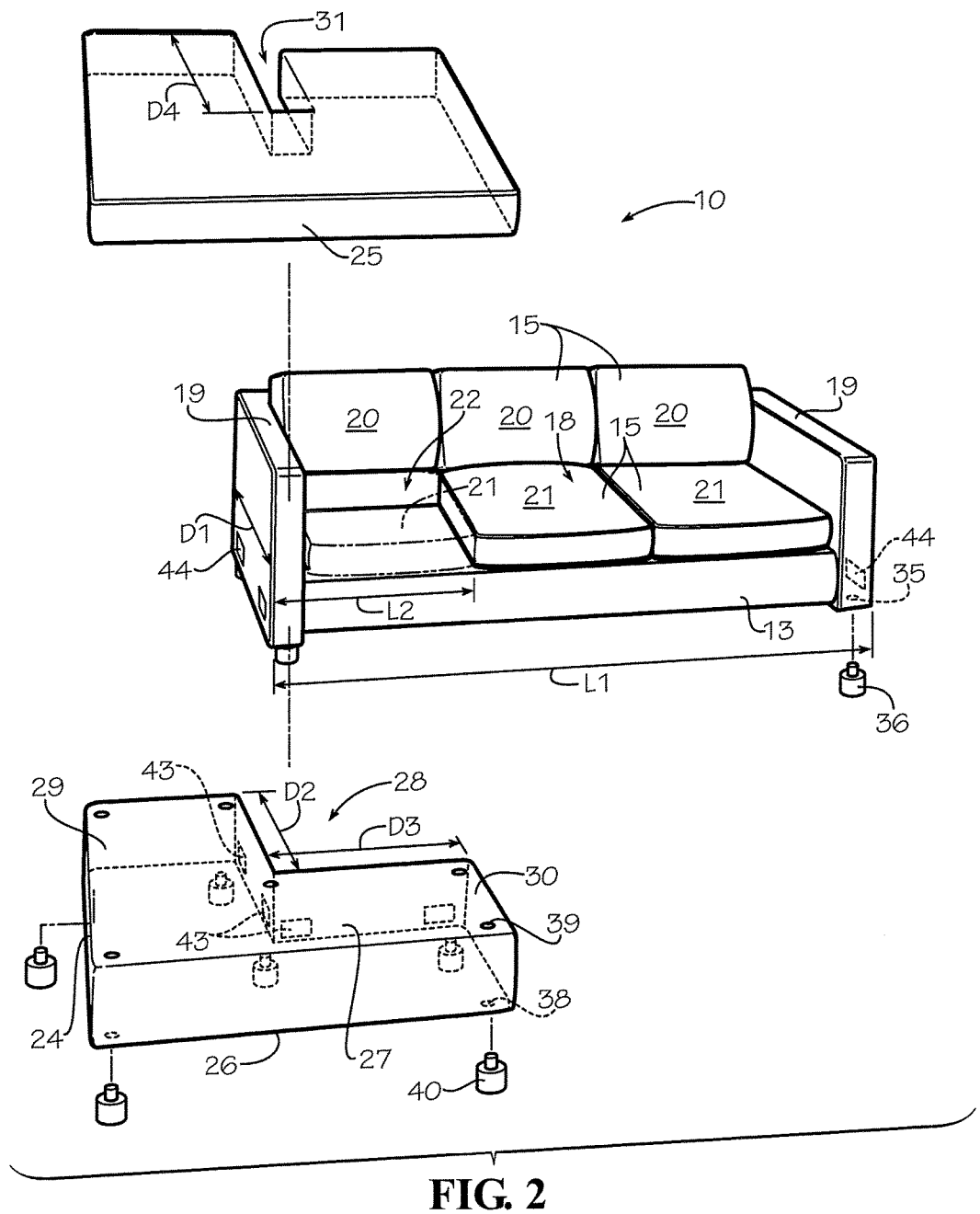
FIG. 2 illustrates an exploded view of the reconfigurable sofa shown in FIG. 1.

The sofa base 13 has a seating area 18 generally defined as the area between two end armrests or arms 19. As shown in the drawings, the seating area 18 includes spacing for three back cushions 20 and three seat cushions 21, however, only two seat cushions 21 may be positioned within the seating area 18 with a cushionless, or empty cushion or seating space 22 occupying the position of the third or missing seat cushion 21 when the addition 14 is coupled to the sofa base 13. The sofa base 13 has a longitudinal length L1 which includes a sub-length L2 which generally extends from the front corner of the base to a position along the length generally including the seating space 22, which also coincides with the commencement of the first or middle seat cushion 21, as shown in FIG. 2. The sofa base 13 also has a depth D1 which generally extends from the front of the sofa base 13 to the backside of the sofa base.

The addition 14 has an L-shaped addition base 24 and a U-shaped addition cushion 25. The addition base 24 has a bottom surface 26 and an oppositely disposed top surface 27. The addition base 24 also has an inside corner 28 which is configured to fit against or nest to an exterior, front corner of the base 13. The inside corner 28 generally defines a first leg 29 having an inside depth D2 which is generally equal to the depth D1 of the base, and a second leg 30 having an inside depth D3 which is generally equal to the sub-length L2 of the base. With these select coordinated depths and/or lengths, the addition base 24 may be positioned against the sofa base 13 so that backside of the sofa base 13 is generally aligned with the backside of the addition base 24 to provide a uniform appearance.

The U-shaped addition cushion 25 is positioned upon the L-shaped addition base 24 and the seating space 22 of the base seating area 18 which could be occupied by a seat cushion (shown as the missing, leftmost seat cushion position in FIG. 2). Thus, the addition cushion 25 completely covers the addition base 24 and the seating space 22 or portion of the seating area 18 directly adjacent the armrest 19. The addition cushion 25 has an arm slot 31 which creates the U-shaped configuration of the addition cushion so that the addition cushion 25 essentially surrounds the addition cushion 25 on three sides. The arm slot 31 has a depth D4 which is generally equal to the depth D1 of the sofa base 13 or generally the length of the arm 19.

The sofa base 13 couples with a plurality of feet to support the sofa base on an underlying surface. The illustrated embodiment of the sofa base 13 includes a series of internally threaded foot bases or threaded T-nuts 35 which are configured to threadably mate with externally threaded feet 36. The threaded movement of the feet 36 into the T-nuts 35 may level the sofa should the floor below the sofa be uneven.

Similarly, the addition base 24 includes a first series of internally threaded foot bases or threaded T-nuts 38 on the bottom surface 26 of the addition base 24, and a second series of internally threaded foot bases or threaded T-nuts 39 on the top surface 27 of the addition base 24. The addition base threaded T-nuts 38 and 39 are each adapted to threadably mate with externally threaded addition feet 40. The addition feet 40 of the addition base 24 are threaded selectively into whichever series of T-nuts 38 and 39 are facing the floor when the addition 14 is in use, as described in more detail hereinafter, to aid in the leveling of the addition 14 when in use.

Figure 4:
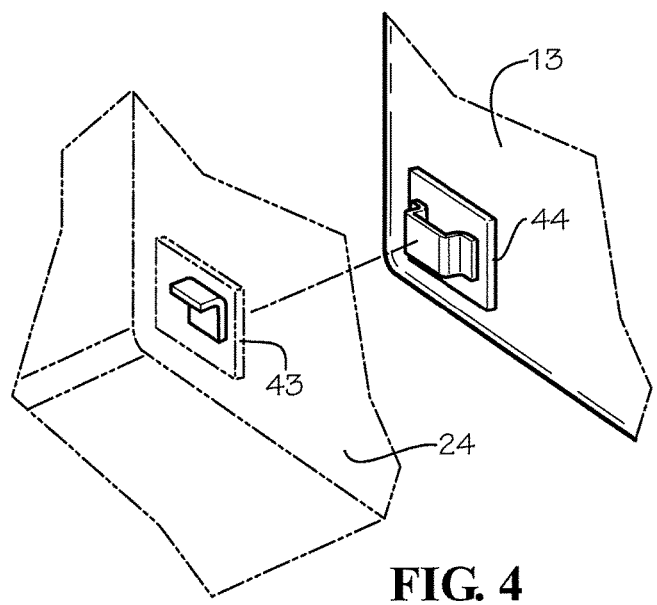
FIG. 4 illustrates the fastening portions of the reconfigurable sofa of FIG. 1.

The sofa base 13 and addition base 24 include mating fastening components to lock or fix the bases together to prevent their separation during use. The fastening components may be any conventionally know fastener, preferably easily unfastenable for convenience, such as a clasp, nut and bolt combination, tongue and groove combination, catch, latch, or the like. For example, FIG. 4 shows the fastening components in the form of a tongue plate 43 mounted to the addition base which is configured to mate with a groove plate 44 mounted to the sofa base 13. Obviously, the goal is to make the fastening components as inconspicuous as possible for the aesthetic of the sofa.

In use, the addition base 24 is releasably mounted, coupled, or locked onto the sofa base 13 through the mating of the fastening components, such as the tongue plate 43 of the addition base 24 mating with the groove plate 44 of the sofa base 13. The depth D2 of the addition base is generally equal to the depth D1 of the sofa base, so that the interior corner 28 of the addition base 24 nests against the front corner of the sofa base 13 and the backsides of the bases 13 and 24 appear uniform. Similarly, the interior corner depth D3 generally equals or coincides with the sofa base sub-length L2 so that the addition base 24 terminates at the general location of the end of the seating space 22 or the commencement of the middle seat cushion 21. Once the addition base 24 is mounted, the U-shaped addition cushion 25 is placed upon the addition base 24 with the sofa armrest 19 positioned within the arm slot 31, i.e., the cushion 25 wraps about three sides of the armrest. Thus, the addition cushion 25 has a portion which serves as a seat cushion for the sofa base 13 and a portion which serves as a cushion for the L-shaped base 24. It should be noted that the addition cushion 25 covers the T-nuts 39 positioned on the top surface 27 of the addition base when the addition is in this orientation and covers the T-nuts 38 when the addition base 24 is in an inverted orientation.

Figure 3:
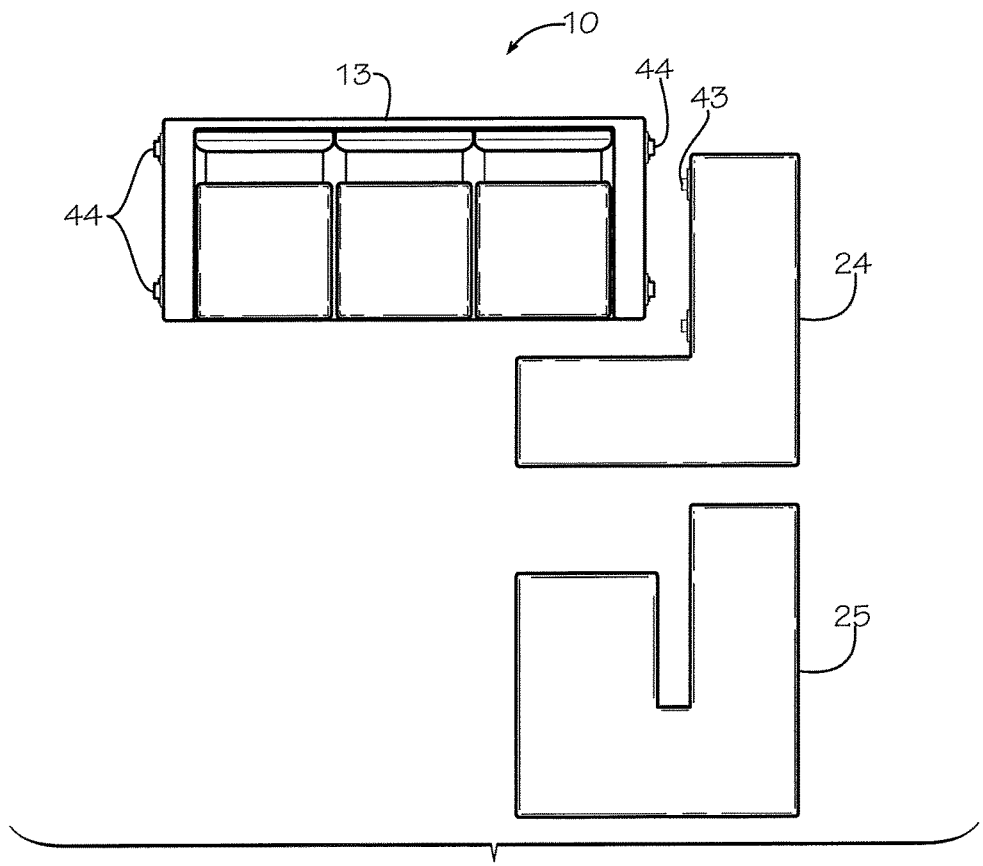
FIG. 3 illustrates a partially exploded top view of the reconfigurable sofa shown in FIG. 1.

Should it be desired to move the addition 14 from the left side of the sofa base 13, as shown in FIGS. 1 and 2, to the right side of the base, as shown in FIG. 3, the addition 14 is simply raised slightly to disengage the tongue plate 43 from the groove plate 44. The addition base 24 is then moved to the opposite side of the sofa base 13 and the tongue plate 43 is then reengaged with the groove plate 44 on this side. This interchanging of positions may occur if the interior corner depth D2 is generally equal to the interior corner depth D3, as the positions of these two depths interchange when moving the addition from one side of the sofa base 13 to the other.

However, if the interior corner depths D2 and D3 are different, the sofa base 13 must be inverted or flipped over when moving from one end position to the other, such that the depth D3 remains against the front (equal to sub-length L2) of the sofa base and the depth D2 remains against the end (equal to depth D1) of the sofa base. It is for this reason that the addition base 24 includes T-nuts on both the bottom surface 26 and the top surface 27 of the addition base, so as to accept the feet 40 selectively upon whichever series of T-nuts (38 or 39) are facing downwardly towards the floor.

Once the addition base 24 is coupled to the sofa base 13, the addition cushion 25 may be positioned upon the addition base and a portion of the seating area 18 of the sofa base. If the two portion of the cushion on either side of the are slot 31 are generally the same, the addition cushion 25 need not be flipped over or inverted. However, if the two portions are of different sizes or configurations, as shown in FIG. 3, the cushion is inverted so that the portion which was residing within the sofa base seating area 18 remains in the sofa base seating area, albeit on the opposite end of the sofa base 13.

It should be understood that the sofa base 13 and the addition 14 should be made of the same or coordinating materials to provide a consistent look or appears to the sofa 10.

It should be understood that as used herein the terms depth and length may be used interchangeable.

It should also be understood that the sofa may include a complete set of seating cushions (an ancillary seat cushion), wherein the third seat cushion is replaced by the addition cushion should the addition be utilized, as illustrated in phantom line in FIG. 2.

This completes the description of the preferred embodiment of the invention. Those skilled in the art may recognize other equivalents to the specific embodiment described herein which equivalents are intended to be encompassed by the claims attached hereto.

The invention claimed is:

1. A sofa comprising:
 a sofa base having two oppositely disposed armrests and a seating area including an empty seating space, and
 an addition removably coupled to said sofa base, said addition having a L-shaped addition base and a U-shaped cushion configured to wrap about three sides of one said armrest and be positioned upon said L-shaped base and upon said sofa base to occupy said empty seating space.

2. The sofa of claim 1 wherein said L-shaped addition base has a top surface and a bottom surface, and wherein said L-shaped addition base also includes a plurality of feet adapted to be coupleable selectively to one of either said top surface and said bottom surface depending upon the orientation of said L-shaped addition base.

3. The sofa of claim 1 wherein said L-shaped addition base is removably coupled to said sofa base through a set of tongue and groove type fasteners.

4. The sofa of claim 1 further comprising an ancillary seat cushion to replace said U-shaped cushion upon said sofa base in the event the addition is not coupled to said sofa base.

5. A sofa comprising:
 a sofa base having a first overall length and a first sub-length extending from one end of said sofa base, said sofa base also having an overall depth along said one end of said sofa base extending from a front of the sofa base to a back of the sofa base, and
 an addition having
  an addition base
   having a front side and a back side with
   a first leg extending between the front side and the back side and with a first interior depth generally equal to said overall depth of said one end of said sofa base and a second leg extending along said front side with a second interior depth generally equal to said first sub-length of said sofa base, said addition also having an addition cushion having a first portion overlaying said addition base first leg and said addition base second leg and a second portion overlaying at least a portion of said sofa base.

6. The sofa of claim 5 wherein said addition base has a top surface and a bottom surface, and wherein said addition base also includes a plurality of feet adapted to be coupleable selectively to one of either said top surface and said bottom surface depending upon the orientation of said addition base.

7. The sofa of claim 6 wherein said addition base is removably coupled to said sofa base through fasteners.

8. The sofa of claim 7 wherein said fasteners are a set of tongue and groove type fasteners.

9. The sofa of claim 7 wherein said sub-length includes a width of an armrest positioned upon said one end and a seating space void of a sofa base cushion.

10. The sofa of claim 5 further comprising an ancillary seat cushion to replace said addition cushion upon said sofa base in the event the addition is not utilized with said sofa base.

11. A sofa comprising:

a sofa base having two oppositely disposed armrests and a seating area including at least one seat cushion and a seating space void of a sofa base seat cushion, and an addition removably coupled to said sofa base, said addition having a L-shaped addition base and an addition cushion configured to occupy said sofa base seating space and overlay said L-shaped addition base.

12. The sofa of claim 11 wherein said L-shaped addition base has a top surface and a bottom surface, and wherein said L-shaped addition base also includes a plurality of feet adapted to be coupleable selectively to one of either said top surface and said bottom surface depending upon the orientation of said L-shaped addition base.

13. The sofa of claim 11 wherein said L-shaped addition base is removably coupled to said sofa base through a set of tongue and groove type fasteners.

14. The sofa of claim 11 wherein said sofa base includes two oppositely disposed armrests, and wherein said addition cushion includes an armrest slot configured to receive one said armrest.

15. The sofa of claim 11 further comprising an ancillary seat cushion to replace said addition cushion upon said sofa base in the event the addition is not coupled to said sofa base.

\* \* \* \* \*